US011183371B2

(12) United States Patent
Fujii et al.

(10) Patent No.: US 11,183,371 B2
(45) Date of Patent: Nov. 23, 2021

(54) PLASMA PROCESSING APPARATUS AND PLASMA PROCESSING METHOD

(71) Applicant: Tokyo Electron Limited, Tokyo (JP)

(72) Inventors: Toru Fujii, Miyagi (JP); Yoshitomo Konta, Miyagi (JP); Kohei Otsuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/724,757

(22) Filed: Dec. 23, 2019

(65) Prior Publication Data

US 2020/0211826 A1 Jul. 2, 2020

(30) Foreign Application Priority Data

Dec. 27, 2018 (JP) .............................. JP2018-246076

(51) Int. Cl.
*H01J 37/32* (2006.01)
*H01L 21/67* (2006.01)
*H01L 21/683* (2006.01)
*H01L 21/3065* (2006.01)

(52) U.S. Cl.
CPC .. *H01J 37/32522* (2013.01); *H01J 37/32183* (2013.01); *H01J 37/32449* (2013.01); *H01J 37/32559* (2013.01); *H01J 37/32724* (2013.01); *H01L 21/3065* (2013.01); *H01L 21/67069* (2013.01); *H01L 21/6833* (2013.01); *H01J 2237/002* (2013.01); *H01J 2237/3343* (2013.01)

(58) Field of Classification Search
CPC ........... H01J 37/32724; H01J 37/32522; H01J 37/32183; H01J 37/32449; H01J 37/32559; H01J 2237/3343; H01J 2237/002; H01L 21/67069; H01L 21/3065; H01L 21/6833; H01L 21/67109; H01L 21/67248

See application file for complete search history.

(56) References Cited

U.S. PATENT DOCUMENTS

| 5,525,159 A * | 6/1996 | Hama ................. H01J 37/3244 118/723 I |
| 2005/0236377 A1* | 10/2005 | Hoffman ........... H01J 37/32082 219/121.43 |
| 2007/0175396 A1* | 8/2007 | Kasai .................. H01J 37/3244 118/723 R |

FOREIGN PATENT DOCUMENTS

JP 2009-212340 A 9/2009

\* cited by examiner

*Primary Examiner* — Yuechuan Yu
(74) *Attorney, Agent, or Firm* — Pearne & Gordon LLP

(57) ABSTRACT

A plasma processing apparatus includes a processing vessel; a placing table, serving as a lower electrode, disposed within the processing vessel; an upper electrode serving as a facing electrode of the placing table; a plasma processor configured to form a gas within the processing vessel into plasma by supplying a high frequency power and to process a processing target object on the placing table with the plasma; a cover member configured to cover the upper electrode from thereabove; a cooler provided within the cover member and configured to cool the upper electrode with a coolant having a temperature lower than a dew point temperature of exterior air outside the processing vessel; and a gas supply configured to supply a low-dew point gas having a dew point temperature lower than the dew point temperature of the exterior air into a space surrounded by the cover member and the upper electrode.

11 Claims, 9 Drawing Sheets

PLASMA PROCESSING APPARATUS AND PLASMA PROCESSING METHOD

CROSS-REFERENCE TO RELATED APPLICATION

This application claims the benefit of Japanese Patent Application No. 2018-246076 filed on Dec. 27, 2018, the entire disclosure of which is incorporated herein by reference.

TECHNICAL FIELD BACKGROUND

The various aspects and embodiments described herein pertain generally to a plasma processing apparatus and a plasma processing method.

BACKGROUND

Patent Document 1, for example, describes a substrate processing apparatus equipped with a shower head disposed to face a susceptor which is configured to place a semiconductor wafer W thereon and configured to apply a high frequency voltage into a processing chamber. This shower head has an electrode layer exposed to an inside of the processing chamber, a heating layer and a cooling layer. The heating layer covers an entire surface of the electrode layer. The cooling layer covers an entire surface of the electrode layer via with the heating layer therebetween. A heat transfer layer, which is filled with a heat transfer gas, is provided between the heating layer and the cooling layer.

Patent Document 1: Japanese Patent Laid-open Publication No. 2009-212340

SUMMARY

In one exemplary embodiment, there is provided a plasma processing apparatus including a processing vessel, a placing table, an upper electrode, a plasma processor, a cover member, a cooler and a gas supply. The placing table, serving as a lower electrode, is disposed within the processing vessel. The upper electrode serves as a facing electrode of the placing table. The plasma processor is configured to form a gas within the processing vessel into plasma by supplying a high frequency power to at least one of the placing table or the upper electrode, and is configured to process a processing target object on the placing table with the plasma. The cover member is configured to cover the upper electrode from thereabove. The cooler is provided within the cover member and is configured to cool the upper electrode with a coolant having a temperature lower than a dew point temperature of exterior air outside the processing vessel. The gas supply is configured to supply a low-dew point gas having a dew point temperature lower than the dew point temperature of the exterior air into a space surrounded by the cover member and the upper electrode.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
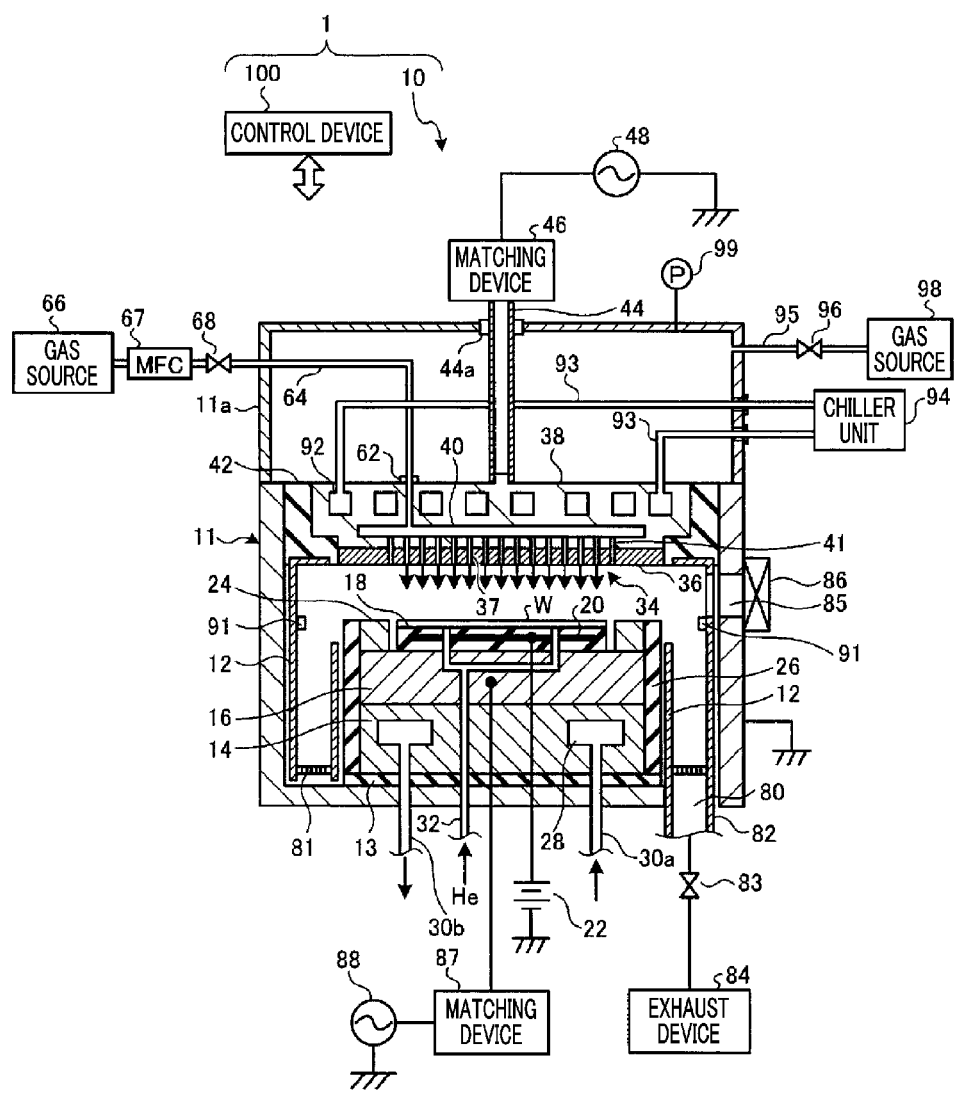
FIG. 1 is a schematic cross sectional view illustrating an example a plasma processing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a plasma processing apparatus and a plasma processing method of the present disclosure will be described in detail with reference to the accompanying drawings. However, it should be note that the plasma processing apparatus and the plasma processing method of the present disclosure are not limited to the exemplary embodiments to be described below. Further, the various exemplary embodiments can be appropriately combined as long as the contents of processings are not contradictory.

In an apparatus configured to perform a processing by using plasma, a temperature of an upper electrode may be increased due to heat input from the plasma. Further, even if the temperature of the upper electrode is not increased that much, it may be required to maintain the upper electrode at a low temperature depending on a processing condition. In such a case, the upper electrode is controlled to a preset temperature by being cooled with a low-temperature coolant.

If the low-temperature coolant is flown, a temperature of a pipeline through which the coolant flows and a temperature of a member cooled by the coolant are lowered, so that condensation may occur at portions of the pipeline and the member which are in contact with air. If such condensation takes places, an electric component provided at the upper electrode may be broken due to moisture generated by the condensation. Further, a water droplet formed by the moisture generated by the condensation may disturb distribution of a high frequency power supplied to an inside of a processing chamber via the upper electrode.

In view of the foregoing, the present disclosure provides a technique of suppressing the condensation near the upper electrode.

First Exemplary Embodiment

[Configuration of Plasma Processing Apparatus 1]

FIG. 1 is a schematic cross sectional view illustrating an example of a plasma processing apparatus according to a first exemplary embodiment. The plasma processing apparatus 1 is configured to perform a plasma processing such as etching or film formation on a semiconductor wafer (hereinafter, simply referred to as "wafer") as an example of a processing target object. The plasma processing apparatus 1 includes an apparatus main body 10 and a control device 100. The plasma processing apparatus 1 is disposed within a clean room or the like in which a temperature and a humidity of air are regulated within preset ranges.

The apparatus main body 10 has a substantially cylindrical processing vessel 11 made of, by way of example, aluminum having an anodically oxidized surface. The processing vessel 11 is frame-grounded. A column-shaped supporting table 14 is disposed at a bottom of the processing vessel 11 with an insulating plate 13 made of ceramic or the like therebetween, and a placing table 16 made of, by way of non-limiting example, aluminum is disposed on the supporting table 14. The placing table 16 serves as a lower electrode.

Disposed on a top surface of the placing table 16 is an electrostatic chuck 18 configured to attract and hold the wafer W by an electrostatic force. The electrostatic chuck 18 has a structure in which an electrode 20 made of a conductive film is embedded between a pair of insulating layers or insulating sheets. The electrode 20 is electrically connected with a DC power supply 22. The wafer W is attracted to and held on a top surface of the electrostatic chuck 18 by an electrostatic force such as a Coulomb force generated in the top surface of the electrostatic chuck 18 by a DC voltage applied from the DC power supply 22.

To improve etching uniformity, a conductive edge ring 24 made of, for example, silicon is disposed on the top surface of the placing table 16, surrounding the electrostatic chuck 18. A cylindrical inner wall member 26 made of, by way of example, quartz is provided along side surfaces of the placing table 16 and the supporting table 14.

A path 28 is provided within the supporting table 14, and a coolant from a chiller unit provided at an outside of the processing vessel 11 is supplied into the path 28 via a pipeline 30a. The coolant supplied into the path 28 is returned back into the chiller unit via a pipeline 30b. The chiller unit is configured to control a temperature of the coolant to be supplied into the path 28. As the temperature-controlled coolant circulates within the path 28, a temperature of the supporting table 14 is controlled, so that a temperature of the wafer W on the electrostatic chuck 18 is controlled via the electrostatic chuck 18 and the placing table 16 on the supporting table 14.

A pipeline 32 is provided within the supporting table 14, the placing table 16 and the electrostatic chuck 18. A heat transfer gas supplied into the pipeline 32 from a non-illustrated heat transfer gas supply mechanism is supplied into a gap between the wafer W and the electrostatic chuck 18 through the pipeline 32. The heat transfer gas may be, for example, a helium gas. By controlling a pressure of the heat transfer gas supplied into the gap between the wafer W and the electrostatic chuck 18, a heat transfer coefficient between the wafer W and the electrostatic chuck 18 can be controlled.

A shower head 34 is disposed above the placing table 16, facing the placing table 16 substantially in parallel. The shower head 34 also serves as an upper electrode. That is, the shower head 34 and the placing table 16 serve as a pair of electrodes (the upper electrode and the lower electrode). A space between the shower head 34 and the placing table 16 is configured as a plasma formation space.

The shower head 34 is supported at an upper portion of the processing vessel 11 with an insulating shield member 42 therebetween. The shower head 34 includes a ceiling plate 36 disposed to directly face the placing table 16; and a base member 38 configured to support the ceiling plate 36 from above.

A multiple number of discharge holes 37 is formed through the ceiling plate 36 in a thickness direction thereof to discharge a processing gas into the processing vessel 11. The ceiling plate 36 is made of, by way of non-limiting example, silicon or SiC.

The base member 38 is made of a conductive material such as, but not limited to, aluminum having an anodically oxidized surface. The base member 38 supports the ceiling plate 36 at a lower portion thereof in a detachable manner. A diffusion space 40 through which the processing gas is supplied into the multiple number of discharge holes 37 is formed within the base member 38. A multiple number of through holes 41 is formed in a bottom portion of the base member 38 to be located under the diffusion space 40. These through holes 41 communicate with the discharge holes 37, respectively.

The base member 38 is provided with an inlet opening 62 through which the processing gas is introduced into the gas diffusion space 40. One end of a pipeline 64 is connected to this inlet opening 62, and the other end of the pipeline 64 is connected to a gas source 66 configured to supply the processing gas. The pipeline 64 is equipped with a mass flow controller (MFC) 67 and a valve 68 in sequence from an upstream side. When a plasma processing is performed on the wafer W on the electrostatic chuck 18, the processing gas supplied from the gas source 66 is introduced into the diffusion space 40 via the pipeline 64 and diffused within the diffusion space 40. The processing gas diffused in the diffusion space 40 is then supplied into the processing vessel 11 in a shower shape through the through holes 41 and the discharge holes 37.

Further, a path 92 is formed within the base member 38, and a coolant from a chiller unit 94 provided at the outside of the processing vessel 11 is supplied into the path 92 via a pipeline 93. The coolant supplied from the chiller unit 94 into the path 92 of the base member 38 via the pipeline 93 is circulated within the path 92 and then returned back into the chiller unit 94 via the pipeline 93. The base member 38 and the pipeline 93 are connected with a non-illustrated insulating member therebetween. The chiller unit 94 is configured to control a temperature of the coolant to be supplied into the path 92. The chiller unit 94 is an example of a temperature controller. As the temperature-controlled coolant circulates within the path 92, a temperature rise of the shower head 34 due to the heat input from the plasma formed between the placing table 16 and the shower head 34 is suppressed.

The temperature of the coolant circulated within the path 92 is lower than a dew point temperature of exterior air outside the processing vessel 11. In the present exemplary embodiment, the temperature of the coolant is, for example, equal to or less than 0° C. The base member 38 having the path 92 formed therein is an example of a cooler.

Further, a high frequency power supply 48 is electrically connected to the base member 38 via a power feed rod 44 and a matching device 46. In the present exemplary embodiment, the power feed rod 44 is a hollow cylindrical member made of a conductive metal such as aluminum. The power feed rod 44 is an example of a conductive member. The high frequency power supply 48 is a power supply for plasma formation, and is configured to generate a high frequency power having a frequency equal to or higher than 13.56 MHz, for example, 60 MHz. The high frequency power generated by the high frequency power supply 48 is supplied to the base member 38 via the matching device 46 and the power feed rod 44. The high frequency power supply 48 is an example of a plasma processor. The matching device 46 is configured to match a load impedance with an internal (or output) impedance of the high frequency power supply 48. The matching device 46 serves to control the output impedance of the high frequency power supply 48 and the load impedance to be apparently matched with each other, when the plasma is formed within the processing vessel 11. An output terminal of the matching device 46 is electrically connected with an upper end of the power feed rod 46.

The shower head 34 and a part of the power feed rod 44 are covered by a substantially cylindrical cover member 11a which is provided above a sidewall of the processing vessel 11. The cover member 11a is made of a conductive material such as aluminum, and is grounded via the processing vessel 11. With this configuration, leakage of the high frequency power supplied to the shower head 34 to an outside of the apparatus main body 10 is suppressed. An opening 44a surrounded by an insulating member is formed at a ceiling portion of the cover member 11a, and the power feed rod 44 connects the base member 38 and the matching device 46 through the opening 44a. A plurality of pipelines such as the pipeline 64 and the pipeline 93 is disposed within a space surrounded by the cover member 11a and the shower head 34. Besides these pipelines, electric components such as various kinds of sensors are also disposed within this space surrounded by the cover member 11a and the shower head 34. In the following, the space surrounded by the cover member 11a and the shower head 34 is referred to as an "antenna chamber". Furthermore, non-illustrated seal members are provided between the cover member 11a and the processing vessel 11, between the cover member 11a and the pipeline 64, between the opening 44a and the power feed rod 44, between the pipeline 93 and the cover member 11a, and so forth, so that the antenna chamber has airtightness to some extent.

A pressure gauge 99 is connected to the cover member 11a. The pressure gauge 99 is configured to measure a pressure within the antenna chamber. A gas having a dew point temperature lower than that of the exterior air outside the processing chamber 11 is supplied into the antenna chamber from a gas source 98 via a pipeline 95. The pipeline 95 is equipped with a valve 96. In the following, the gas having the dew point temperature lower than that of the exterior air outside the processing chamber 11 is referred to as a "low-dew point gas". In the present exemplary embodiment, the gas source 98 supplies dry air into the antenna chamber as the low-dew point gas. Alternatively, the low-dew point gas may be an inert gas such as an argon gas or a nitrogen gas as long as its dew point temperature is lower than the dew point temperature of the exterior air outside the processing chamber 11. The valve 96 is an example of a gas supply.

A high frequency power supply 88 is electrically connected via a matching device 87 to the placing table 16 serving as the lower electrode. The high frequency power supply 88 is a power supply for ion attraction (bias), and is configured to supply a high frequency power having a frequency ranging from 300 kHz to 13.56 MHz, for example, 2 MHz to the placing table 16. The matching device 87 is configured to match a load impedance with an internal (or output) impedance of the high frequency power supply 88. The matching device 87 serves to control the internal impedance of the high frequency power supply 88 and the load impedance to be apparently matched with each other, when the plasma is formed within the processing vessel 11.

An exhaust port 80 is provided at the bottom of the processing vessel 11. An exhaust device 84 is connected to the exhaust port 80 via an exhaust line 82 and an APC (Auto Pressure Control) valve 83. The exhaust device 84 has a vacuum pump such as a turbo molecular pump, and is capable of decompressing the inside of the processing vessel 11 to a required vacuum level. The APC valve 83 is configured to adjust a pressure within the processing vessel 11.

An opening 85 through which the wafer W is carried in/out is provided at the sidewall of the processing vessel 11, and this opening 85 is opened or closed by a gate valve 86. Further, a deposition shield 12 configured to suppress adhesion of an etching byproduct (deposit) to the processing vessel 11 is detachably provided along an inner sidewall of the processing vessel 11. The deposition shield 12 is also provided on an outer surface of the inner wall member 26. Near the bottom of the processing vessel 12, an exhaust plate 81 is provided between the deposition shield 12 on the inner sidewall of the processing vessel 11 and the deposition shield 12 on the inner wall member 26. The deposition shield 12 and the exhaust plate 81 may be made of, by way of example, an aluminum member coated with ceramic such as $Y_2O_3$.

A GND block 91, which is made of a conductive member and is DC-connected to the ground, is provided at the deposition shield 12, which is disposed along the inner sidewall of the processing vessel 11, such that it is located at a height position substantially on a level with the wafer W.

The GND block 91 is configured to suppress an abnormal discharge within the processing vessel 11.

An overall operation of the apparatus main body 10 having the above-described configuration is controlled by the control device 100. The control device 100 is equipped with a processor, a memory and an input/output interface. The memory stores therein a program or a processing recipe. The processor executes the program read from the memory, thus controlling the individual components of the apparatus main body 10 via the input/output interface according to the processing recipe read from the memory.

When a processing using plasma is performed on the wafer W in the plasma processing apparatus 1 having the above-described configuration, the control device 100 performs the following controls over the individual components of the plasma processing apparatus 1, for example. First, in the state that the wafer W is placed on the electrostatic chuck 18, the control device 100 controls the MFC 67 and the valve 68 to supply a processing gas of a preset flow rate into the diffusion space 40. The processing gas supplied into the diffusion space 40 is diffused within the diffusion space 40, and then, supplied into the processing vessel 11 in a shower shape through the through holes 41 and the discharge holes 37. Further, the control device 100 controls the APC valve 83 and the exhaust device 84 so that the inside of the processing vessel 11 is set to a preset pressure.

Then, the control device 100 controls the high frequency power supply 48 to generate a high frequency power of a preset frequency for plasma formation and supplies this generated high frequency power to the shower head 34 via the power feed rod 44. Accordingly, the processing gas within the processing vessel 11 is formed into plasma. Further, the control device 100 controls the high frequency power supply 88 to generate a high frequency power of a predetermined frequency for ion attraction (bias) and supplies this generated high frequency power to the placing table 16. Accordingly, charged particles such as ions in the plasma are attracted into the wafer W on the electrostatic chuck 18. As a result, a preset plasma processing such as etching is performed on the wafer W on the electrostatic chuck 18.

When performing the processing by using the plasma, a temperature of the shower head 34 may be increased due to the heat input from the plasma. Further, even if the temperature of the shower head is not increased that much, it may be required to maintain the shower head 34 at a low temperature depending on a processing condition. In such a case, the shower head 34 is controlled to a preset temperature by being cooled with the low-temperature coolant having a temperature controlled by the chiller unit 94.

If the low-temperature coolant is flown, a temperature of a surface of the pipeline 93 through which the coolant flows and a temperature of the base member 38 cooled by the coolant are lowered, so that the condensation may occur at portions of the pipeline 93 and the base member 38 which are in contact with air. If the condensation takes place, the electric components provided at the shower head 34 may be broken due to moisture generated by the condensation. Further, if water droplets are generated on a surface of the power feed rod 44 due to the moisture generated by the condensation, a surface resistance of the power feed rod 33 is disturbed, so that distribution of the high frequency power supplied to the shower head 34 via the power feed rod 44 may be disturbed. If the distribution of the high frequency power supplied to the shower head 34 is disturbed, distribution of the high frequency power supplied to the inside of the processing vessel 11 via the shower head 34 is also disturbed, resulting in deterioration of uniformity of the plasma processing upon the wafer W.

It may be considered to cover, with a heat insulator, the members which are supposed to be cooled. However, since the multiple pipelines and the electric components such as the sensors are disposed within the antenna chamber surrounded by the cover member 11a, there is little space for providing the heat insulator within the antenna chamber. Thus, it is difficult to cover all the members to be cooled with the heat insulator. In view of this, according to the present exemplary embodiment, the condensation within the antenna chamber is suppressed by filling the antenna chamber with the low-dew point gas.

[Pressure Control within Antenna Chamber]

Figure 2:
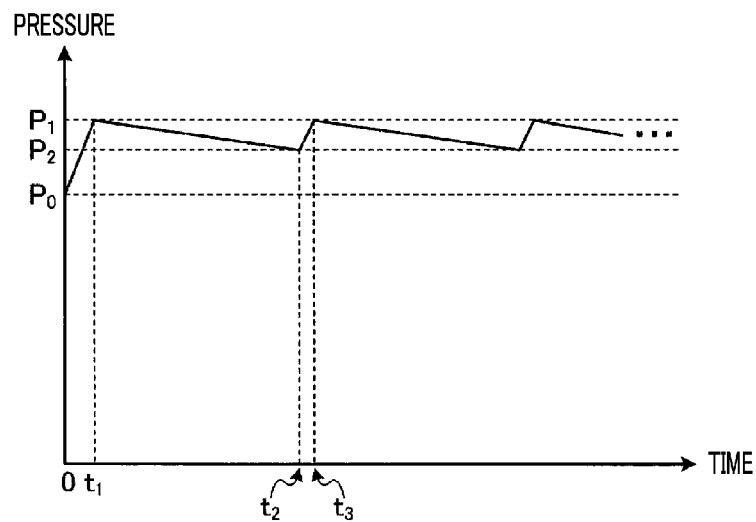
FIG. 2 is a diagram illustrating an example of a pressure variation within an antenna chamber.

FIG. 2 is a diagram illustrating an example of a pressure variation within the antenna chamber. In an initial state, the antenna chamber is filled with the same air as the exterior air outside the processing vessel 11, and a pressure within the antenna chamber is set to a pressure $P_0$ (e.g., 1 atmosphere) which is the same as a pressure of the exterior air outside the processing vessel 11. The exterior air outside the processing vessel 11 has a temperature of, e.g., 25° C. and a humidity of, e.g., 50%.

In the present exemplary embodiment, the control device 100 controls the valve 96 to supply the low-dew point gas into the antenna chamber before starting the cooling of the shower head 34 by the chiller unit 94. Since the inside of the antenna chamber has the airtightness to some extent, the pressure within the antenna chamber is increased, as illustrated in FIG. 2, for example, as the low-dew point gas is supplied.

By referring to a measurement value by the pressure gauge 99, the control device 100 controls the valve 96 to stop the supply of the low-dew point gas into the antenna chamber at a time $t_1$ when the pressure within the antenna chamber reaches a pressure $P_1$ higher than the pressure $P_0$ of the exterior air outside the processing chamber 11. The pressure $P_1$ is, for example, 1.2 atmosphere. Although the inside of the antenna chamber has the airtightness to some extent, the degree of the airtightness is not that high. Therefore, air and the low-dew point gas within the antenna chamber leak to the outside of the antenna chamber. As a result, the pressure within the antenna chamber gradually decreases.

Then, the control device 100 controls the valve 96 to resume the supply of the low-dew point gas into the antenna chamber at a time $t_2$ when the pressure within the antenna chamber becomes equal to or less than a pressure $P_2$ which is higher than the pressure $P_0$ and lower than the pressure $P_1$. The pressure $P_2$ may be, for example, 1.1 atmosphere. Accordingly, the pressure within the antenna chamber increases again. Then, the controller 100 controls the valve 96 to stop the supply of the low-dew point gas into the antenna chamber again at a time $t_3$ when the pressure within the antenna chamber becomes equal to or higher than the pressure $P_1$.

As stated above, in the present exemplary embodiment, the control device 100 controls the supply and the stop of the supply of the low-dew point gas into the antenna chamber such that the pressure within the antenna chamber becomes a positive pressure. Accordingly, the air containing moisture is exhausted slowly from the antenna chamber along with the low-dew point gas, so that the inside of the antenna chamber is filled with the low-dew point gas. Therefore, the condensation within the antenna chamber is suppressed.

[Connection of Pipeline 93 and Cover Member 11a]

Here, if the pipeline 93 through which the coolant flows is directly fixed to the cover member 11a, the cover member 11a may be deprived of heat by the pipeline 93 which has been cooled by the coolant, and a temperature of the cover member 11a may be decreased. Since the antenna chamber is filled with the low-dew point gas, condensation in an inside of the cover member 11a is suppressed. However, since an outside of the cover member 11a is in contact with the exterior air outside the cover member 11a, condensation may occur at the outside of the cover member 11a. In case that the condensation takes place at the outside of the cover member 11a, electric components disposed at the outside of the apparatus main body 10 may be broken due to moisture generated by the condensation.

Figure 3:
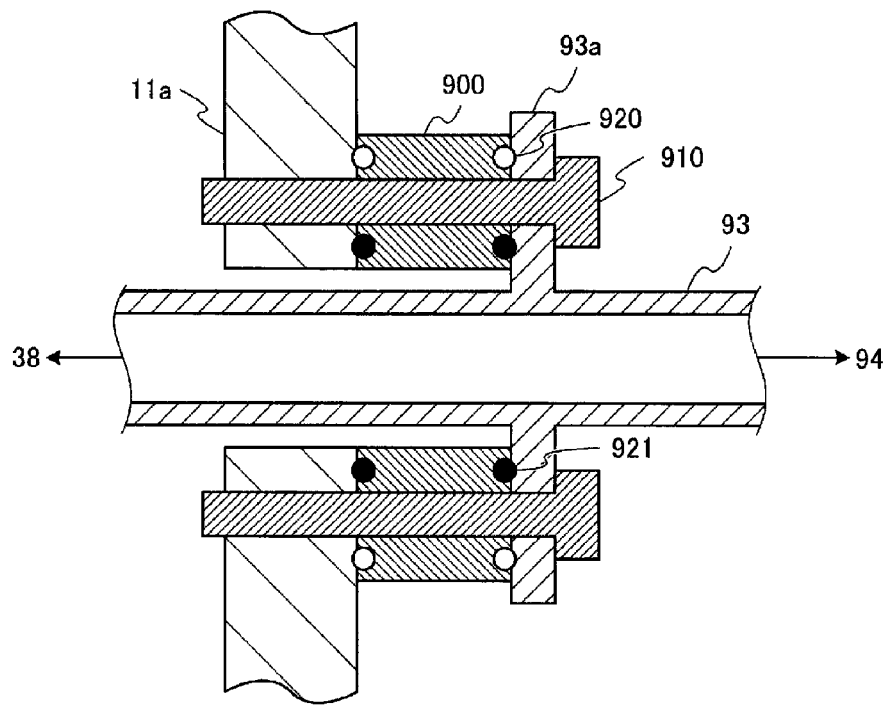
FIG. 3 is an enlarged cross sectional view illustrating a method of fixing a pipeline to a cover member.

In view of this, in the present exemplary embodiment, a heat insulating member 900 made of a material having low thermal conductivity is provided between the cover member 11a and a flange 93a of the pipeline 93, and the flange 93 of the pipeline 93 is fixed to the cover member 11a by a screw 910. FIG. 3 is an enlarged cross sectional view illustrating an example of a method of fixing the pipeline 93 to the cover member 11a. In the fixing method shown in FIG. 3, the flange 93a of the pipeline 93 is fixed to the cover member 11a by the screw 910 which is made of a conductive material. Accordingly, a potential difference between the cover member 11a and the pipeline 93 is reduced by the screw 910.

Further, if a material without having electromagnetic shielding property (the function to shield an electromagnetic wave) is used as the heat insulating member 900, the high frequency power supplied to the shower head 34 may leak to the outside of the apparatus main body 10 from a gap between the cover member 11a and the flange 93a. For this reason, it is desirable that a member having the electromagnetic shielding property as well as the heat insulating property is used as the heat insulating member 900. Accordingly, the transfer of the heat between the cover member 11a and the pipeline 93 and the leakage of the high frequency power from the gap between the cover member 11a and the pipeline 93 can be suppressed.

As the member having the electromagnetic shielding property and the heat insulating property, a resin material having high heat insulating property and containing a power of a metal having high conductivity may be considered. By way of non-limiting example, a PP (Poly Propylene) resin, a PC (Poly Carbonate) resin, an ABS (Acrylonitrile Butadiene Styrene) resin, a nylon resin, PBT (PolyButylene Terephthalate) resin, or a PPS (PolyPhenylene Sulfide) may be used as the resin material. Further, the conductive material in the form of the powder added to the resin material may be, by way of example, carbon fiber.

Furthermore, gaps may exist between the cover member 11a and the heat insulating member 900 and between the heat insulating member 900 and the flange 93 due to surface roughness of the cover member 11a, the heat insulating member 900 and the flange 93a. In views of this, in the present exemplary embodiment, metal seals 920 are provided between the cover member 11a and the heating insulating member 900 and between the heat insulating member 900 and the flange 93a, as illustrated in FIG. 3, for example. Accordingly, the leakage of the high frequency power from the gaps between the cover member 11a and the heat insulating member 900 and between the heat insulating member 900 and the flange 93a is suppressed.

Moreover, in the present exemplary embodiment, O-rings 921 are disposed between the cover member 11a and the heat insulating member 900 and between the heat insulating member 900 and the flange 93a, as depicted in FIG. 3, for example. Accordingly, the airtightness of the antenna chamber can be maintained.

Figure 4:
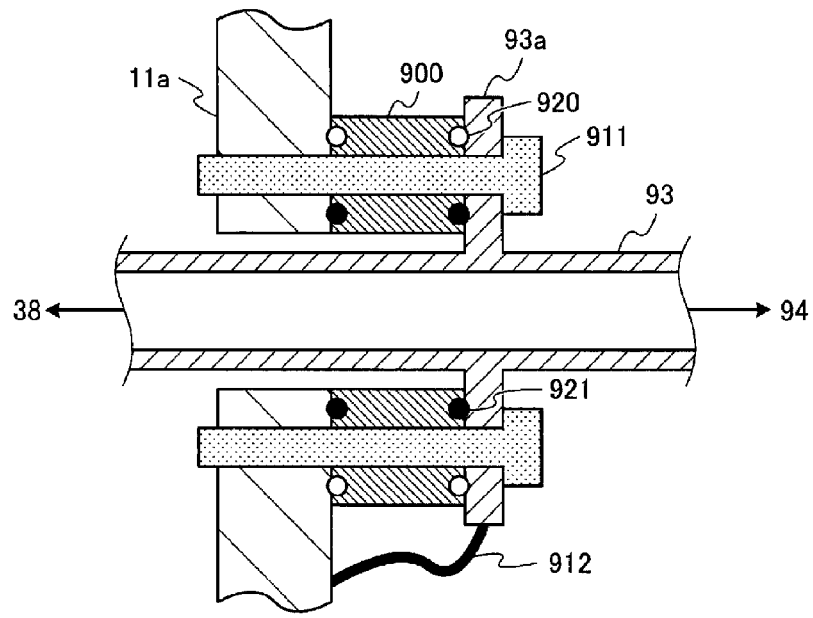
FIG. 4 is an enlarged cross sectional view illustrating another example of fixing the pipeline to the cover member.

Here, the method of fixing the pipeline 93 to the cover member 11a is not limited to the example fixing method shown in FIG. 3. FIG. 4 is an enlarged cross sectional view illustrating another example fixing method of the pipeline 93 to the cover member 11a. In the fixing method shown in FIG. 4, the flange 93a of the pipeline 93 is fixed to the cover member 11a by a screw 911 which is made of a material having low thermal conductivity, such as a resin. Accordingly, the heat transfer between the flange 93a and the cover member 11a is further suppressed. Furthermore, in the fixing method shown in FIG. 4, since electric connection between the cover member 11a and the pipeline 93 is not enough, the cover member 11a and the flange 93 are connected through a jumper wire 912. With the fixing method shown in FIG. 4 as well, the heat transfer between the cover member 11a and the pipeline 93 and the leakage of the high frequency power from the gap between the cover member 11a and the pipeline 93 are suppressed.

Figure 5:
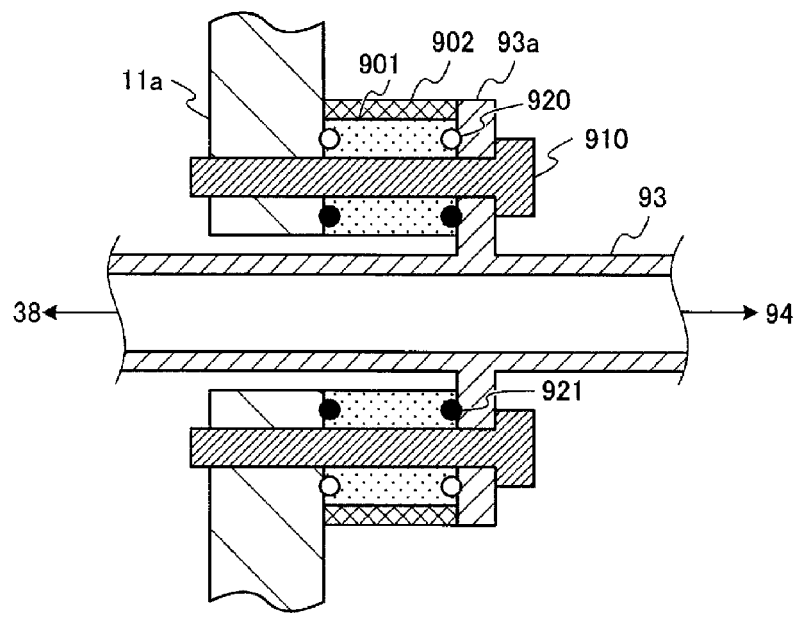
FIG. 5 an enlarged cross sectional view illustrating yet another example of fixing the pipeline to the cover member.

FIG. 5 is an enlarged cross sectional view illustrating yet another example fixing method of the pipeline 93 to the cover member 11a. In the fixing method shown in FIG. 5, a heat insulating member 901 which does not have the electromagnetic shielding property and is made of a material having low thermal conductivity is disposed between the cover member 11a and the flange 93a of the pipeline 93, and the flange 93a of the pipeline 93 is fixed to the cover member 11a by the screw 910. Further, a paint 902 having the electromagnetic shielding property is coated on a side surface of the heat insulating member 901. A mixture of a paint resin and a powder of a conductive material may be used as the paint 902. Accordingly, the heat transfer between the cover member 11a and the flange 93a is suppressed by the heat insulating member 901, and the leakage of the high frequency power from the gap between the cover member 11a and the flange 93a is suppressed by the paint 902. Thus, the fixing method shown in FIG. 5 is also capable of suppressing the heat transfer between the cover member 11 and the pipeline 93 and the leakage of the high frequency power from the gap between the cover member 11a and the pipeline 93.

Figure 6:
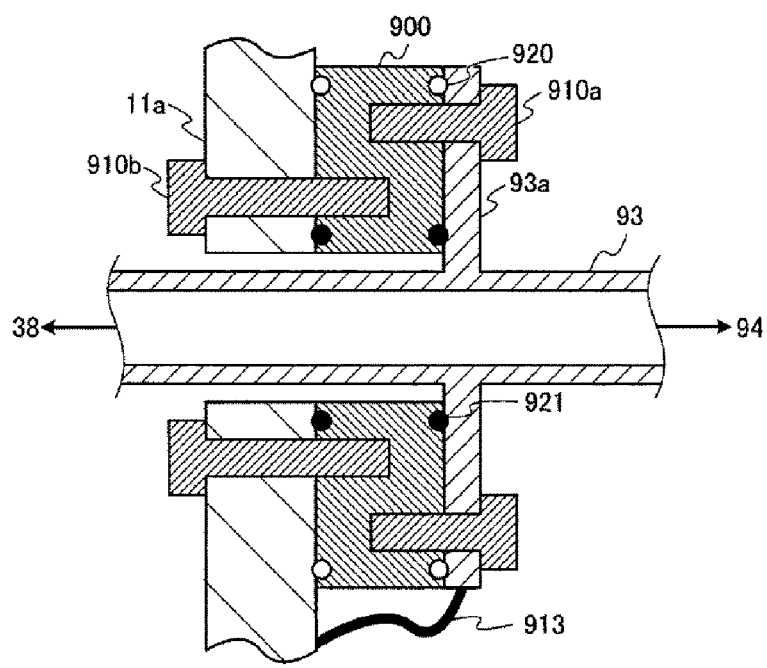
FIG. 6 is an enlarged cross sectional view illustrating still yet another example of fixing the pipeline to the cover member.

FIG. 6 is an enlarged cross sectional view illustrating still yet another example fixing method of the pipeline 93 to the cover member 11a. In the fixing method shown in FIG. 6, the heat insulating member 900 is fixed to the cover member 11a by a screw 910b, and the flange 93a of the pipeline 93 is fixed to the heat insulating member 900 by a screw 910a. The screw 910a and the screw 910b are not in contact with each other. Accordingly, the heat transfer via the screws for fixing the heating insulating member 900 is suppressed. Furthermore, in the fixing method shown in FIG. 6, since the electric connection between the cover member 11a and the pipeline 93 is not enough, the cover member 11a and the flange 93a are connected through a jumper wire 913. The fixing method shown in FIG. 6 is also capable of suppressing the heat transfer between the cover member 11a and the pipeline 93 and the leakage of the high frequency power from the gap between the cover member 11a and the pipeline 93.

[Plasma Processing Method]

Figure 7:
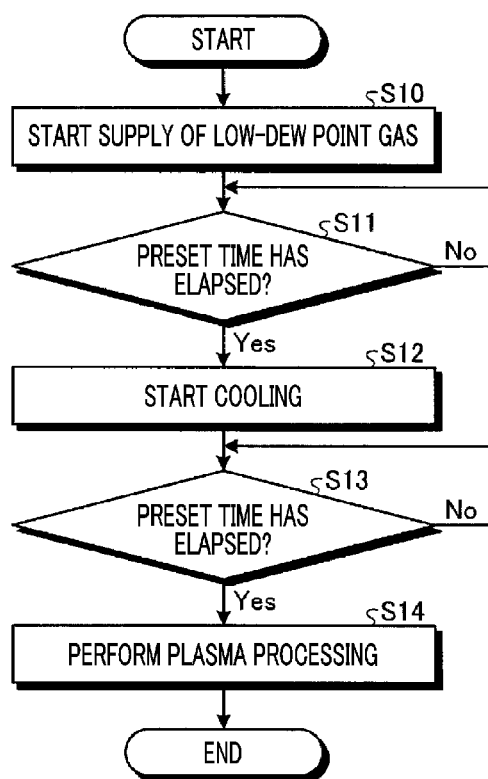
FIG. 7 is a flowchart illustrating an example of a plasma processing method according to the first exemplary embodiment.

FIG. 7 is a flowchart illustrating an example of a plasma processing method according to the first exemplary embodiment. Processings shown in FIG. 7 are carried out as the control device 100 controls the individual components of the apparatus main body 10.

First, the control device 100 starts a supply of the low-dew point gas into the antenna chamber by opening the valve 96 (S10). Then, until the plasma processing upon the wafer W is completed, the control device 100 controls the supply and a stop of the supply of the low-dew point gas into the antenna chamber such that a pressure within the antenna chamber becomes a positive pressure. The process S10 is an example of a supplying process.

Subsequently, the control device 100 determines whether a preset time has elapsed after the supply of the low-dew point gas into the antenna chamber is begun (S11). The preset time in the process S11 refers to a time required until the air containing the moisture is completely exhausted from a gap of the antenna chamber and the antenna chamber is thus filled with the low-dew point gas through the supply of the low-dew point gas into the antenna chamber. If the preset time has not elapsed after the supply of the low-dew point gas into the antenna chamber is begun (S11: No), the control device 100 performs the processing of the process S11 again.

Meanwhile, if the preset time has elapsed after the supply of the low-dew point gas into the antenna chamber is begun (S11: Yes), the control device 100 controls the chiller unit 94 to start cooling of the shower head 34 (S12). The process S12 is an example of a cooling process.

Thereafter, the control device 100 determines whether a predetermined time has elapsed after the cooling of the shower head 34 is begun (S13). The predetermined time in the process S13 refers to a time required until the shower head 34 is cooled to a required temperature. If the predetermined time has not elapsed after the cooling of the shower head 34 is begun (S13: No), the control device 100 performs the processing of the process S13 again.

Meanwhile, if the predetermined time has elapsed after the cooling of the shower head 34 is begun (S13: Yes), the control device 100 performs the plasma processing upon the wafer W by controlling the individual components of the apparatus main body 10 (S14). The process S14 is an example of a plasma process. Then, the example plasma processing method shown in the present flowchart is ended.

So far, the first exemplary embodiment has been described. As stated above, the plasma processing apparatus 1 according to the present exemplary embodiment is equipped with the processing vessel 11, the placing table 16, the shower head 34, the high frequency power supply 48, the cover member 11a, the base member 38 and the valve 96. The placing table 16 is disposed within the processing vessel 11 and serves as the lower electrode. The shower head 34 serves as the facing electrode of the placing table 16. The high frequency power supply 48 forms the plasma from the gas within the processing vessel 11 by supplying the high frequency power to the shower head 34, and the wafer W on the placing table 16 is processed by the plasma. The cover member 11a covers the shower head 34 from thereabove. The base member 38 is provided within the cover member 11a and cools the shower head 34 by using the coolant having the temperature lower than the dew point temperature of the exterior air outside the processing vessel 11. The valve 96 supplies the low-dew point gas having the dew point temperature lower than that of the exterior air into the space surrounded by the cover member 11a and the shower head 34. Accordingly, the condensation near the shower head 34 can be suppressed.

Further, in the above-described first exemplary embodiment, the low-dew point gas is an inert gas or dry air.

Therefore, the condensation within the antenna chamber surrounded by the cover member 11a and the shower head 34 can be suppressed.

Moreover, in the above-described first exemplary embodiment, the valve 96 controls a flow rate of the low-dew point gas such that the pressure within the antenna chamber surrounded by the cover member 11a and the shower head 34 becomes a positive pressure. Accordingly, the air containing the moisture is pushed out from the antenna chamber, so that the condensation within the antenna chamber can be suppressed.

In addition, in the above-described first exemplary embodiment, the plasma processing apparatus 1 is further equipped with the chiller unit 94 and the pipeline 93. The chiller unit 94 is provided at the outside of the cover member 11a and controls the temperature of the coolant to be supplied to the base member 38. A part of the pipeline 93 is disposed within the cover member 11a, and the rest of the pipeline 93 is disposed at the outside the cover member 11a. The coolant the temperature of which is adjusted by the chiller unit 94 is supplied to the base member 38 through this pipeline 93. Further, the pipeline 93 is fixed to the sidewall of the cover member 11a with the heat insulating member 900 having the electromagnetic shielding property and the heat insulating property therebetween. With this configuration, the condensation at the cover member 11a can be suppressed, and the leakage of the high frequency power from a joint portion between the cover member 11a and the pipeline 93 can be suppressed.

Second Exemplary Embodiment

In the plasma processing apparatus 1 according to the first exemplary embodiment, as the low-dew point gas is supplied into the antenna chamber and the air containing the moisture is thus pushed out from the antenna chamber, the inside of the antenna chamber is filled with the low-dew point gas. If, however, the airtightness of the antenna chamber is low, it is difficult to suppress the introduction of the exterior air into the antenna chamber even if the inside of the antenna chamber is set to be under the positive pressure. Thus, the antenna chamber needs to have a certain degree of airtightness. If, however, the degree of the airtightness of the antenna chamber is increased, it takes time to replace the gas within the antenna chamber.

In consideration of the foregoing, in a second exemplary embodiment, the gas within the antenna chamber is forcibly exhausted by the exhaust device 84 before the supply of the low-dew point gas into the antenna chamber is begun. Accordingly, the time required to replace the gas within the antenna chamber can be shortened. Furthermore, since the airtightness of the antenna chamber can be increased, the leakage of the low-dew point gas can be suppressed, so that the consumption of the low-dew point gas can be reduced.

Figure 8:
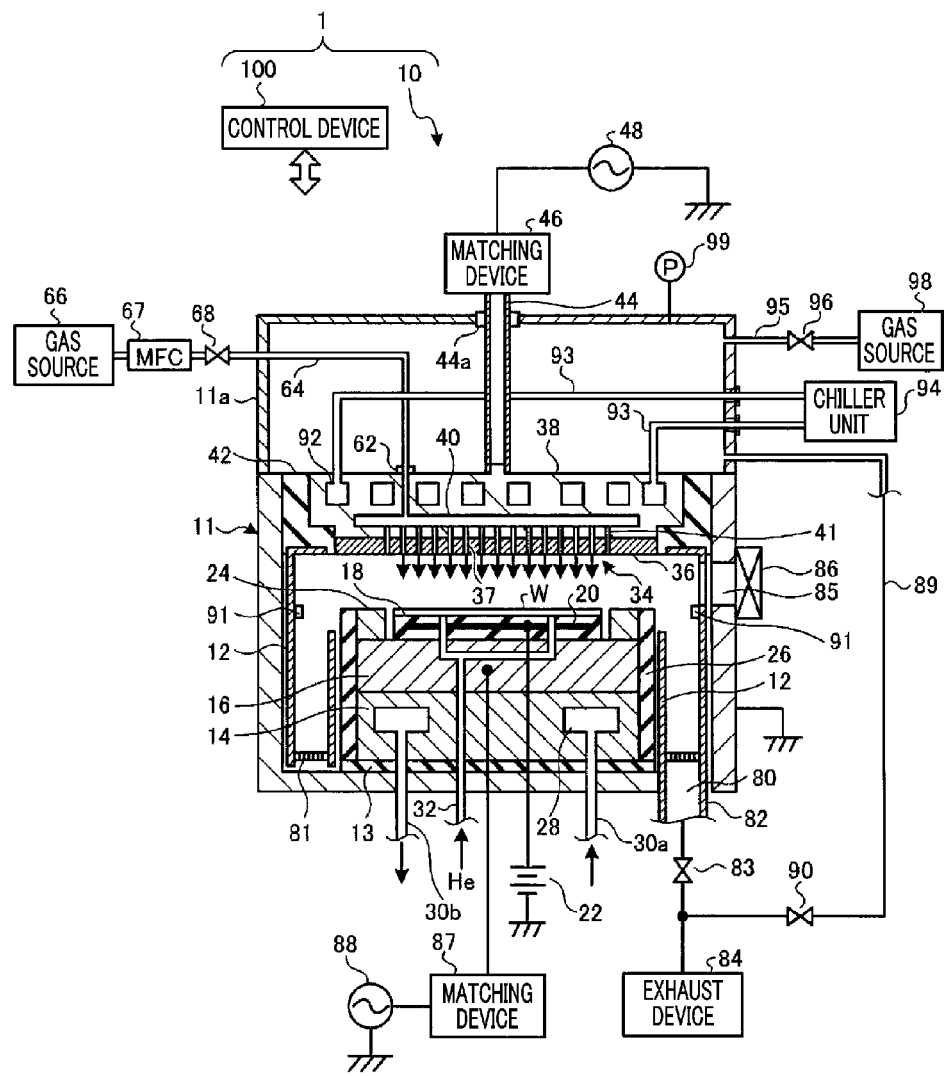
FIG. 8 is a schematic cross sectional view illustrating an example of a plasma processing apparatus according to a second exemplary embodiment.

FIG. 8 is a schematic cross sectional view illustrating an example of a plasma processing apparatus 1 according to the second exemplary embodiment. The plasma processing apparatus 1 of the second exemplary embodiment is different from the plasma processing apparatus 1 of the first exemplary embodiment in that a pipeline 89 and a valve 90 are further provided. In FIG. 8, parts assigned same reference numerals as those of FIG. 1 have the same configurations or same functions as those of FIG. 1, and redundant description will be omitted.

The pipeline 89 connects the antenna chamber and the exhaust device 84 via the valve 90. The valve 90 is opened before the low-dew point gas is supplied into the antenna chamber. Air within the antenna chamber is exhausted via the pipeline 89 and the valve 90 by the exhaust device 84.

Figure 9:
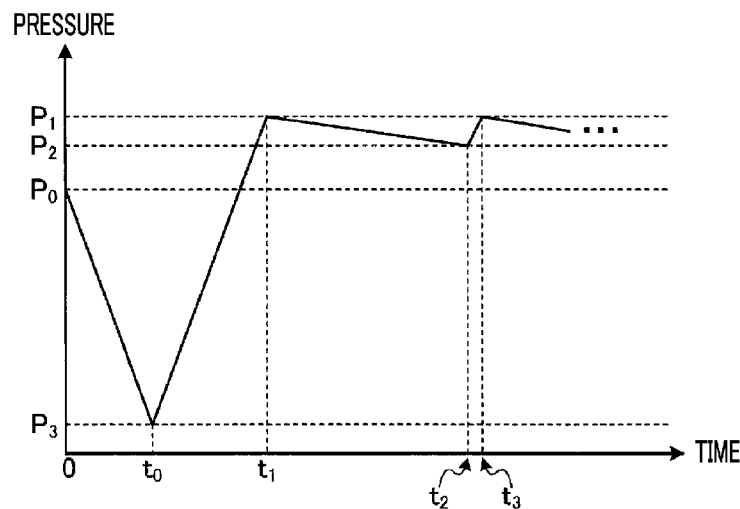
FIG. 9 is a diagram illustrating an example of a pressure variation within an antenna chamber.

FIG. 9 is a diagram illustrating a pressure variation within the antenna chamber. In the present exemplary embodiment, the control device 100 opens the valve 90 before the low-dew point gas is supplied into the antenna chamber and controls the exhaust device 84 to exhaust the air within the antenna chamber. Accordingly, a pressure within the antenna chamber is decreased. Then, by referring to a measurement value of a pressure gauge 99, the control device 100 closes the valve 90 and stops the exhaust device 84 at a time $t_0$ when the pressure within the antenna chamber becomes equal to or less than a pressure $P_3$ lower than a pressure $P_0$ of the exterior air outside the processing vessel 11. The pressure $P_3$ is, e.g., 0.1 atmosphere.

Then, the control device 100 starts the supply of the low-dew point gas into the antenna chamber by controlling the valve 96. By referring to the measurement value of the pressure gauge 99, the control device 100 then stops the supply of the low-dew point gas into the antenna chamber by controlling the valve 96 at a time $t_1$ when the pressure within the antenna chamber becomes equal to or higher than a pressure $P_1$. Thereafter, the same as in the first exemplary embodiment, the supply and the stop of the supply of the low-dew point gas into the antenna chamber are controlled such that the pressure within the antenna chamber becomes the positive pressure (that is, a pressure between the pressure $P_1$ and the pressure $P_2$).

[Plasma Processing Method]

Figure 10:
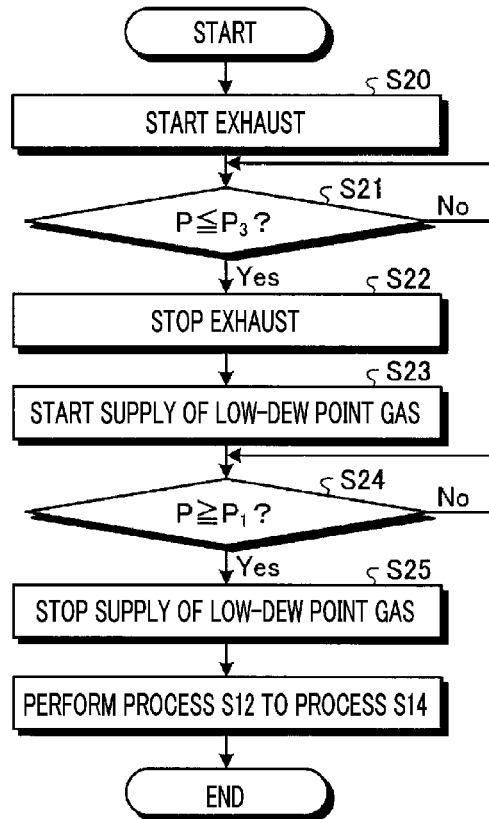
FIG. 10 is a flowchart illustrating an example of a plasma processing method according to the second exemplary embodiment.

FIG. 10 is a flowchart illustrating an example of a plasma processing method according to the second exemplary embodiment. Processings shown in FIG. 10 are carried out as the control device 100 controls individual components of the apparatus main body 10.

First, the control device 100 turns the valve 90 into an open state and operates the exhaust device 84, thus starting an exhaust of the air within the antenna chamber (S20). Then, by referring to the measurement value of the pressure gauge 99, the control device 100 determines whether the pressure P within the antenna chamber becomes equal to or less than the pressure $P_3$ (S21). If the pressure P within the antenna chamber is higher than the pressure $P_3$ (S21: No), the control device 100 performs the processing of the process S21 again.

Meanwhile, if the pressure P within the antenna chamber becomes equal to or less than the pressure $P_3$ (S21: Yes), the control device 100 turns the valve 90 into a closed state and stops the operation of the exhaust device 84, thus stopping the exhaust of the air within the antenna chamber (S22).

Subsequently, the control device 100 starts the supply of the low-dew point gas into the antenna chamber by turning the valve 96 into the open state (S23). Then, by referring to the measurement value of the pressure gauge 99, the control device 100 determines whether the pressure P within the antenna chamber becomes equal to or higher than the pressure $P_1$ (S24). If the pressure P within the antenna chamber is lower than the pressure $P_1$ (S24: No), the control device 100 performs the processing of the process S24 again.

Meanwhile, if the pressure P within the antenna chamber is equal to or higher than the pressure $P_1$ (S24: Yes), the control device 100 stops the supply of the low-dew point gas into the antenna chamber by turning the valve 96 into the closed state (S25). Thereafter, the processes S12 to S14 described in FIG. 7 are performed.

So far, the second exemplary embodiment has been described. As stated above, the plasma processing apparatus 1 of the second exemplary embodiment is equipped with the exhaust device 84 configured to exhaust the gas within the antenna chamber which is surrounded by the cover member 11a and the shower head 34. The valve 96 begins the supply of the low-dew point gas after the pressure within the antenna chamber becomes equal to or less than the preset pressure $P_3$. Accordingly, the time required to replace the gas within the antenna chamber can be shortened. Furthermore, the consumption of the low-dew point gas can be reduced.

Third Exemplary Embodiment

Since the power feed rod 44 is the hollow cylindrical member, air exists in an internal space of the power feed rod 44. If the internal space of the power feed rod 44 and the antenna chamber do not communicate with each other, the air still exists in the internal space of the power feed rod 44 even if the inside of the antenna chamber is filled with the low-dew point gas. If the shower head 34 is cooled, the power feed rod 44 which supplies the high frequency power to the shower head 34 is deprived of heat by the shower head 34, so that a temperature of the power feed rod 44 is lowered. If the temperature of the power feed rod 44 is lowered, the condensation may form on an inner wall of the power feed rod 44 due to moisture of the air which exists in the internal space of the power feed rod 44.

If the condensation forms on the inner wall of the power feed rod 44, a surface resistance of the inner wall of the power feed rod 44 may be partially changed because of water droplets formed by the condensation. As a result, the distribution of the high frequency power supplied to the shower head 34 via the power feed rod 44 may be disturbed.

Figure 11:
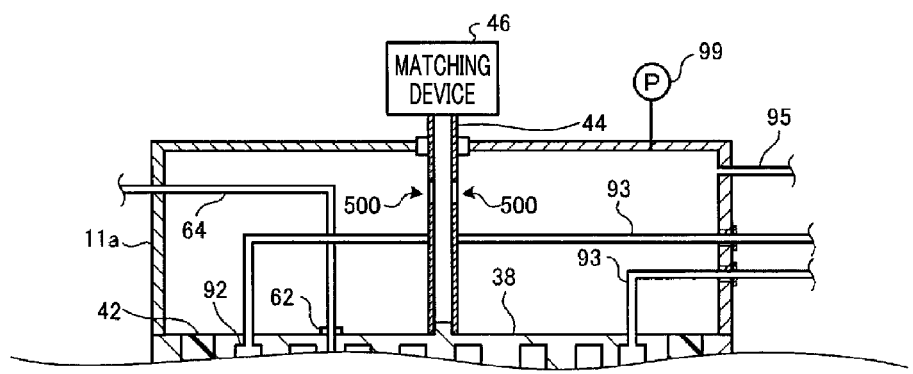
FIG. 11 is a partially enlarged cross sectional view illustrating an example of a plasma processing apparatus according to a third exemplary embodiment.

In view of the foregoing, in a third exemplary embodiment, a through hole 500 through which the internal space of the power feed rod 44 and the antenna chamber communicate with each other is formed at a sidewall of the power feed rod 44. FIG. 11 is a partially enlarged cross sectional view illustrating an example of a plasma processing apparatus 1 according to the third exemplary embodiment.

If at least one through hole 500 is formed at the sidewall of the power feed rod 44, the internal space of the power feed rod 44 and the antenna chamber are allowed to communicate with each other. Therefore, the condensation on the inner wall of the power feed rod 44 can be suppressed. If, however, the through hole 500 is formed at the sidewall of the power feed rod 44, the surface resistance of the power feed rod 44 may differ at a surface portion of the power feed rod 44 where the through hole 500 is formed and a surface portion thereof where the through hole 500 is not formed. As a result, the distribution of the high frequency power supplied to the shower head 34 via the power feed rod 44 may become non-uniform.

In view of this, it is desirable that multiple through holes 500 are formed at axially symmetrical positions of the sidewall of the power feed rod 44 and the respective through holes 500 have the same shape and the same size. Desirably, the number of the through holes 500 formed at the axially symmetrical positions of the sidewall of the power feed rod 44 may be equal to or larger than three.

Moreover, it is desirable that the through holes 500 are formed at an upper portion of the sidewall of the power feed rod 44. To elaborate, it is desirable that the through holes 500 are formed at, in portions of the sidewall of the power feed rod 44 disposed within the antenna chamber, a portion higher than a portion corresponding to a half of a length of the power feed rod 44. With this configuration, the distribution of the high frequency power, which is non-uniform on the surface of the power feed rod 44 due to the presence of the through holes 500 formed at the sidewall thereof, may be improved as it approaches the shower head 34.

So far, the third exemplary embodiment has been described. As stated above, the plasma processing apparatus 1 according to the third exemplary embodiment is equipped with the hollow power feed rod 44 disposed within the cover member 11a and configured to guide the high frequency power supplied from the high frequency power supply 48 to the shower head 34. The through holes 500 are formed at the sidewall of the power feed rod 44. The antenna chamber of the cover member 11a and the internal space of the power feed rod 44 communicate with each other through the through holes 500. Accordingly, the condensation on the inner wall of the power feed rod 44 can be suppressed.

Fourth Exemplary Embodiment

If the shower head 34 is cooled, the power feed rod 44 connected to the shower head 34 is deprived of heat by the shower head 34. Accordingly, a part of the power feed rod 44 located at the outside the cover member 11a and the matching device 46 connected to the power feed rod 44 may also be cooled. Since the part of the power feed rod 44 located at the outside of the cover member 11a and the matching device 46 are in contact with the exterior air outside the cover member 11a, the condensation may form if they are cooled. The part of the power feed rod 44 located at the outside the cover member 11a may be covered with a thermal insulator. However, it may be difficult to find a space for disposing the thermal insulator. Furthermore, since it is difficult to cover all electric components within the matching device 46 with the thermal insulator, it is difficult to suppress the condensation on the electric components within the matching device 46.

Figure 12:
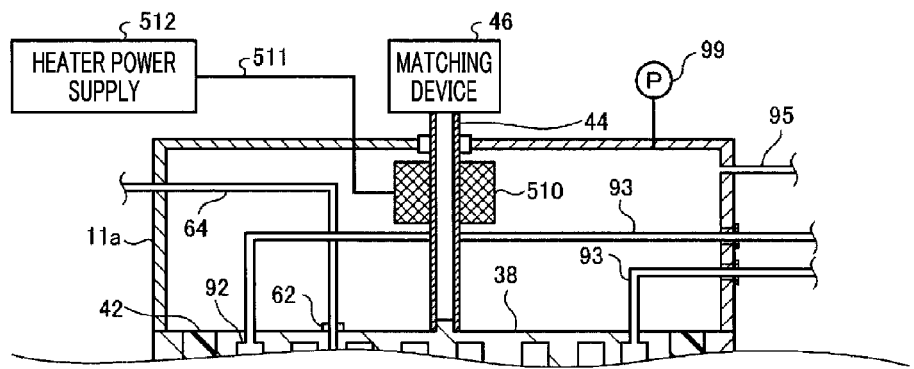
FIG. 12 is a partially enlarged cross sectional view illustrating an example of a plasma processing apparatus according to a fourth exemplary embodiment.

In view of the foregoing, in a fourth exemplary embodiment, the cooling of the power feed rod 44 and the matching device 46 are suppressed by heating a part of the power feed rod 44 by a heater 510, as illustrated in FIG. 12, for example. FIG. 12 is a partially enlarged cross sectional view illustrating an example of a plasma processing apparatus 1 according to the fourth exemplary embodiment.

The heater 510 is configured to heat a part of the power feed rod 44 by a power supplied from a heater power supply 512 via a pipeline 511. Accordingly, the temperature decrease of the power feed rod 44 due to the deprival of heat by the shower head 34 is suppressed, so that the cooling of the matching device 46 is suppressed. Therefore, the condensation on the power feed rod 44 and the matching device 46 are suppressed.

Further, if a distance between a position of the power feed rod 44 heated by the heater 510 and an end portion of the power feed rod 44 connected to the shower head 34 is short, the shower head 34 may be heated by the heater 510. For the reason, it is desirable that the heater 510 is provided around an upper portion of the power feed rod 44. To elaborate, it is desirable that the heater 510 is provided around, in portions of the power feed rod 44 disposed within the antenna chamber, a portion higher than a portion corresponding to a half of a length of the power feed rod 44 disposed within the antenna chamber. With this configuration, the temperature rise of the shower head 34 by the heater 510 can be suppressed.

So far, the fourth exemplary embodiment has been described. As stated above, the plasma processing apparatus 1 according to the present exemplary embodiment is equipped with the power feed rod 44 and the heater 510. A part of the power feed rod 44 is disposed within the cover member 11a, and this power feed rod 44 guides the high frequency power supplied from the high frequency power supply 48 to the shower head 34. The heater 510 covers a part of the power feed rod 44 and heats the power feed rod 44. Accordingly, the condensation on, for example, the matching device 46 disposed at the outside of the cover member 11a and connected to the power feed rod 44 can be suppressed.

Fifth Exemplary Embodiment

In the fourth exemplary embodiment, a part of the power feed rod 44 is heated by heat generated by the heater 510 as the power from the heater power supply 512 is supplied thereto. In a fifth exemplary embodiment, however, a part of the power feed rod 44 is heated by circulating a heated fluid around the power feed rod 44.

Figure 13:
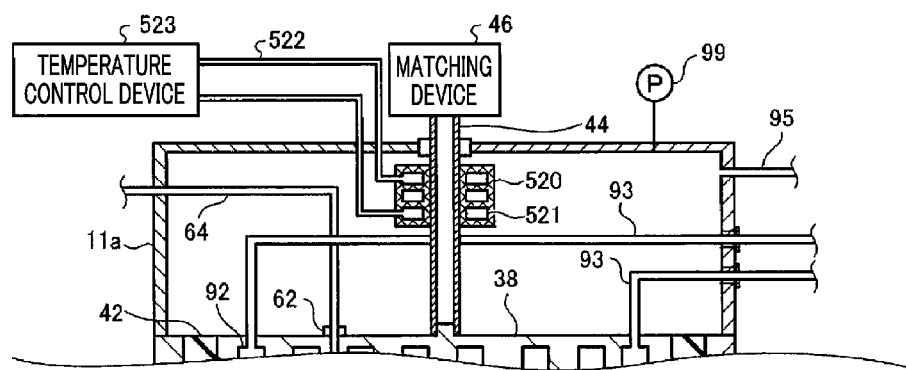
FIG. 13 is a partially enlarged cross sectional view illustrating an example of a plasma processing apparatus according to a fifth exemplary embodiment.

FIG. 13 is a partially enlarged cross sectional view illustrating an example of a plasma processing apparatus 1 according to the fifth exemplary embodiment. In the present exemplary embodiment, a heating jacket 520 having a path 521 therein is provided around a part of the power feed rod 44 disposed within the cover member 11a. A fluid having a temperature controlled by a temperature control device 523 is supplied into the path 521 via a pipeline 522 to be circulated therein.

The fluid supplied into and circulated within the path 521 may be a liquid or a gas. The temperature of the fluid supplied into and circulated within the path 521 is controlled by the temperature control device 523 such that it is higher than the temperature of the coolant circulated within the path 92 of the base member 38. Accordingly, the part of the power feed rod 44 is heated by the heating jacket 520, so that the cooling of the matching device 46 and the like is suppressed.

Further, in the present exemplary embodiment, if a distance between a position of the part of the power feed rod 44 heated by the heating jacket 520 and the end portion of the power feed rod 44 connected to the shower head 34 is short, the shower head 34 may be heated by the heating jacket 520. For the reason, it is desirable that the heating jacket 520 is provided around an upper portion of the power feed rod 44. To elaborate, it is desirable that the heating jacket 520 is provided around, in portions of the power feed rod 44 disposed within the antenna chamber, a portion higher than a portion corresponding to the half of the length of the power feed rod 44 disposed within the antenna chamber. With this configuration, the temperature rise of the shower head 34 by the heating jacket 520 can be suppressed.

So far, the fifth exemplary embodiment has been described. As stated above, the plasma processing apparatus 1 of the present exemplary embodiment is equipped with the power feed rod 44 and the heating jacket 520. A part of the power feed rod 44 is disposed within the cover member 11a and configured to guide the high frequency power supplied from the high frequency power supply 48 to the shower head 34. The heating jacket 520 has therein the path through which the heated fluid flows, and covers a part of the power feed rod 44. The heating jacket 520 heats the power feed rod 44 by the fluid flown in the path. Accordingly, the condensation on the part of the power feed rod 44 disposed outside the cover member 11a and the condensation on the matching device 46 disposed outside the cover member 11a are suppressed.

Sixth Exemplary Embodiment

In the fourth and fifth exemplary embodiments, a part of the power feed rod 44 is heated form the outside of the power feed rod 44. In a sixth exemplary embodiment, however, the power feed rod 44 is heated by circulating a heated fluid within the hollow inside of the power feed rod 44.

Figure 14:
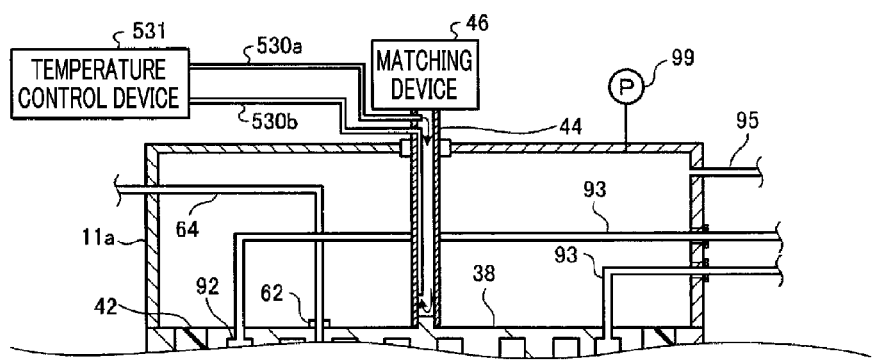
FIG. 14 is a partially enlarged cross sectional view illustrating an example of a plasma processing apparatus according to a sixth exemplary embodiment.

FIG. 14 is a partially enlarged cross sectional view illustrating an example of a plasma processing apparatus 1 according to the sixth exemplary embodiment. In the present exemplary embodiment, an insulating fluid having a temperature controlled by a temperature control device 531 is supplied into the power feed rod 44 via a pipeline 530a. The fluid supplied into the power feed rod 44 is then returned back into the temperature control device 531 via a pipeline 530b. The temperature control device 531 is an example of a fluid supply.

The fluid supplied into and circulated within the power feed rod 44 may be a liquid or a gas. The temperature of the fluid supplied into and circulated within the power feed rod 44 is controlled by the temperature control device 531 such that it is higher than the temperature of the coolant circulated in the path 92 of the base member 38. Accordingly, the power feed rod 44 is heated, and the cooling of the matching device 46 is suppressed.

Further, in the present exemplary embodiment, it is desirable that the fluid having the temperature controlled by the temperature control device 531 is supplied, in the space within the power feed rod 44, from an upper portion of the space, and then, is returned back into the temperature control device 531 from a lower portion of the space. Accordingly, a temperature distribution in which a temperature of the lower portion of the power feed rod 44 is lower than a temperature of the upper portion thereof can be produced. Therefore, the temperature rise of the shower head 34 due to the fluid flowing in the power feed rod 44 can be suppressed.

So far, the sixth exemplary embodiment has been described. As stated above, the plasma processing apparatus 1 according to the present exemplary embodiment is equipped with the hollow power feed rod 44 and the temperature control device 531. The power feed rod 44 is disposed within the cover member 11a and configured to guide the high frequency power supplied from the high frequency power supply 48 to the shower head 34. The temperature control device 531 circulates, in the space within the power feed rod 44, the fluid having the temperature higher than the temperature of the coolant circulated in the path 92 of the base member 38. Accordingly, the condensation on the part of the power feed rod 44 disposed outside the cover member 11a and the condensation on the matching device 46 disposed outside the cover member 11a are suppressed.

OTHERS

The above-described exemplary embodiments are not limiting, and various changes and modifications may be made within the scope of the present disclosure.

By way of example, in the above-described various exemplary embodiments, though the condensation on the members within the antenna chamber is suppressed by filling the antenna chamber with the low-dew point gas, the present disclosure is not limited thereto. For example, as another exemplary embodiment, the antenna chamber may be maintained hermetically, and the air within the antenna chamber may be exhausted such that the pressure of the air within the antenna chamber becomes equal to or less than a preset pressure. The preset pressure may be, e.g., 0.1 atmosphere. This exemplary embodiment may be achieved by a plasma processing apparatus 1 prepared by omitting the pipeline 95, the valve 96 and the gas source 98 from the plasma processing apparatus 1 shown in FIG. 8, for example, and by adding an APC valve instead of the valve 90. The APC valve is an example of a pressure controller. If the pressure of the air is lowered, the dew point temperature of the air is also lowered. Therefore, even if the antenna chamber is not filled with the low-dew point gas, the condensation within the antenna chamber can be suppressed if the pressure of the air within the antenna chamber is lowered.

Furthermore, in the above-described first and second exemplary embodiments, the high frequency power for plasma formation is supplied to the shower head 34. However, the present disclosure is not limited thereto. By way of example, the high frequency power for plasma formation may be supplied to the placing table 16. Even in this case, the temperature of the shower head 34 may be increased due to the heat input from the plasma formed between the shower head 34 and the placing table 16, so that the shower head 34 may be cooled and the condensation may be formed within the cover member 11a. In consideration of this, by filing the inside of the cover member 11a with the low-dew point gas as in the first and second exemplary embodiment, such condensation within the cover member 11a can be suppressed.

Moreover, the first exemplary embodiment or the second exemplary embodiment may be combined with any one of the third to sixth exemplary embodiments. Further, the third exemplary embodiment may be combined with the fourth exemplary embodiment or the fifth exemplary embodiment.

In addition, in the above-described various exemplary embodiments, capacitively coupled plasma (CCP) is used as an example of a plasma source. However, the present disclosure is not limited thereto. By way of example, inductively coupled plasma (ICP), microwave-excited surface wave plasma (SWP), electron cyclotron resonance plasma (ECP), helicon wave plasma (HWP), or the like may be used as the plasma source.

According to the exemplary embodiment, it is possible to suppress condensation in the vicinity of the upper electrode.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing apparatus comprising:
   a processing vessel;
   a placing table, serving as a lower electrode, disposed within the processing vessel;
   an upper electrode serving as a facing electrode of the placing table;
   a plasma processor configured to form a gas within the processing vessel into plasma by supplying a high frequency power to at least one of the placing table or the upper electrode, and configured to process a processing target object on the placing table with the plasma;
   a cover member configured to cover the upper electrode from thereabove;

a cooler provided within the cover member and configured to cool the upper electrode with a coolant having a temperature lower than a dew point temperature of exterior air outside the processing vessel;
a gas supply configured to supply a low-dew point gas having a dew point temperature lower than the dew point temperature of the exterior air into a space surrounded by the cover member and the upper electrode; and
a hollow conductive member disposed within the cover member and configured to guide the high frequency power from the plasma processor to the upper electrode,
wherein a through hole is formed in a sidewall of the hollow conductive member and extends through the hollow conductive member in a longitudinal direction, and
a space within the cover member and an internal space of the hollow conductive member communicate with each other through the through hole.

2. The plasma processing apparatus of claim 1, wherein the low-dew point gas is an inert gas or dry air.

3. The plasma processing apparatus of claim 1, wherein the gas supply controls a flow rate of the low-dew point gas such that a pressure within the space surrounded by the cover member and the upper electrode becomes a positive pressure.

4. The plasma processing apparatus of claim 1, further comprising:
an exhaust device configured to exhaust a gas within the space surrounded by the cover member and the upper electrode,
wherein the gas supply starts a supply of the low-dew point gas after a pressure within the space surrounded by the cover member and the upper electrode becomes equal to or less than a preset pressure.

5. The plasma processing apparatus of claim 1, further comprising:
a heater configured to cover a part of the hollow conductive member and heat the hollow conductive member.

6. The plasma processing apparatus of claim 1, further comprising:
a fluid supply configured to circulate a fluid having a temperature higher than the temperature of the coolant within an internal space of the hollow conductive member.

7. The plasma processing apparatus of claim 1, further comprising:
a temperature controller provided at an outside of the cover member and configured to control the temperature of the coolant; and
a pipeline a part of which is disposed within the cover member and a part of which is disposed at an outside of the cover member, the pipeline being configured to supply the coolant having the temperature controlled by the temperature controller into the cooler,
wherein the pipeline is fixed to a sidewall of the cover member with a member having electromagnetic shielding property and heat insulating property therebetween.

8. A plasma processing apparatus comprising:
a processing vessel;
a placing table, serving as a lower electrode, disposed within the processing vessel;
an upper electrode serving as a facing electrode of the placing table;
a plasma processor configured to form plasma from a gas within the processing vessel by supplying a high frequency power to at least one of the placing table or the upper electrode, and configured to process a processing target object on the placing table with the plasma;
a cover member configured to cover the upper electrode from thereabove;
a cooler provided within the cover member and configured to cool the upper electrode with a coolant having a temperature lower than a dew point temperature of exterior air outside the processing vessel;
an exhaust device configured to exhaust a gas within a space surrounded by the cover member and the upper electrode;
a pressure controller configured to control an exhaust rate of the gas by the exhaust device such that a pressure within the space surrounded by the cover member and the upper electrode becomes equal to or less than a preset pressure; and
a hollow conductive member disposed within the cover member and configured to guide the high frequency power from the plasma processor to the upper electrode,
wherein a through hole is formed in a sidewall of the hollow conductive member and extends through the hollow conductive member in a longitudinal direction, and
a space within the cover member and an internal space of the hollow conductive member communicate with each other through the through hole.

9. The plasma processing apparatus of claim 8, further comprising:
a heater configured to cover a part of the hollow conductive member and heat the hollow conductive member.

10. The plasma processing apparatus of claim 8, further comprising:
a fluid supply configured to circulate a fluid having a temperature higher than the temperature of the coolant within an internal space of the hollow conductive member.

11. The plasma processing apparatus of claim 8, further comprising:
a temperature controller provided at an outside of the cover member and configured to control the temperature of the coolant; and
a pipeline a part of which is disposed within the cover member and a part of which is disposed at an outside of the cover member, the pipeline being configured to supply the coolant having the temperature controlled by the temperature controller into the cooler,
wherein the pipeline is fixed to a sidewall of the cover member with a member having electromagnetic shielding property and heat insulating property therebetween.

* * * * *